United States Patent
Kageyama

(10) Patent No.: US 8,562,794 B2
(45) Date of Patent: Oct. 22, 2013

(54) PROCESS FOR PRODUCING REFLECTIVE MASK BLANK FOR EUV LITHOGRAPHY AND PROCESS FOR PRODUCING SUBSTRATE WITH FUNCTIONAL FILM FOR THE MASK BLANK

(75) Inventor: Junichi Kageyama, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 363 days.

(21) Appl. No.: 12/967,724

(22) Filed: Dec. 14, 2010

(65) Prior Publication Data

US 2012/0145534 A1 Jun. 14, 2012

(51) Int. Cl.
C23C 14/34 (2006.01)

(52) U.S. Cl.
USPC ............ 204/192.11; 204/192.27; 204/192.28; 430/5

(58) Field of Classification Search
USPC ............. 204/192.15, 192.26, 192.27, 192.28, 204/192.11; 430/5
See application file for complete search history.

(56) References Cited

U.S. PATENT DOCUMENTS

| | | | |
|---|---|---|---|
| 6,295,164 B1 * | 9/2001 | Murakami et al. | 359/584 |
| 2004/0231971 A1 * | 11/2004 | Becker et al. | 204/192.11 |
| 2008/0182183 A1 * | 7/2008 | Hayashi et al. | 430/5 |

FOREIGN PATENT DOCUMENTS

| | | | |
|---|---|---|---|
| JP | 06-306596 | * | 11/1994 |
| JP | 2002-69627 | | 3/2002 |
| JP | 2002-146523 | | 5/2002 |

OTHER PUBLICATIONS

Machine Translation JP 06-306596 dated Nov. 1994.*

* cited by examiner

Primary Examiner — Rodney McDonald
(74) Attorney, Agent, or Firm — Oblon, Spivak, McClelland, Maier & Neustadt, L.L.P.

(57) ABSTRACT

To provide a process for producing an EUV mask blank, capable of reducing foreign matter attributable to a sputtering target, and a process for producing a substrate with a functional film for such a mask blank.

A process for producing a reflective mask blank for EUVL, which comprises at least a step of forming a Mo/Si multilayer reflective film, a step of forming a ruthenium (Ru) film or Ru compound film as a protective layer on the multilayer reflective film, and a step of forming an absorber layer to absorb EUV light, on the Ru film or Ru compound film, wherein the formation of the Mo film, the Si film, and the Ru film or Ru compound film, is carried out by means of an ion beam sputtering method, and in the formation of the Si film of the Mo/Si multilayer reflective film and in the formation of the Ru film or Ru compound film, the target angle, the type of the process gas, the process gas pressure, the RF power of ion source, the suppresser voltage, the ion beam voltage and the ion beam current are adjusted to be substantially the same; and based on an erosion region of a sputtering target used for the formation of the Si film, an erosion region and a non-erosion region of a sputtering target to be used for the formation of the Ru film or Ru compound film, are predicted, roughening treatment is applied to the non-erosion region thus predicted of the Ru target or Ru compound target, and then the formation of the Ru film or Ru compound film is carried out.

19 Claims, 3 Drawing Sheets

■ Mo target (boundary unclear)

PROCESS FOR PRODUCING REFLECTIVE MASK BLANK FOR EUV LITHOGRAPHY AND PROCESS FOR PRODUCING SUBSTRATE WITH FUNCTIONAL FILM FOR THE MASK BLANK

TECHNICAL FIELD

The present invention relates to a process for producing a reflective mask blank for EUV (Extreme Ultra Violet) lithography (hereinafter referred to as "EUV mask blank" in this specification) to be used for e.g. the production of semiconductors, and a process for producing a substrate with a functional film for such an EUV mask blank.

BACKGROUND ART

In the semiconductor industry, a photolithography method using visible light or ultraviolet light has been employed as a technique to transfer, on a silicon substrate or the like, a fine pattern which is required for forming an integrated circuit comprising such a fine pattern. For miniaturization of semiconductor devices, it has been attempted to further refine the resolution limit, for example, by a combination of ArF laser (wavelength: 193 nm) and an immersion method, but such a conventional photolithography method has been close to the limit. Under the circumstances, as an exposure technique for further miniaturization, an EUV lithography is considered to be promising which is an exposure technique employing EUV light having a wavelength further shorter than ArF laser. In this specification, "EUV light" means a ray having a wavelength in a soft X-ray region or a vacuum ultraviolet ray region, specifically a ray having a wavelength of from about 10 to 20 nm, particularly about 13.5 nm ±0.3 nm.

EUV light is apt to be absorbed by any substances and the refractive indices of 13.5 nm±substances are close to 1 at this wavelength, whereby it is impossible to use a dioptric system like a conventional photolithography employing visible light or ultraviolet light. Therefore, in EUV photolithography, a catoptric system, i.e. a combination of a reflective photomask and a mirror, is employed.

A mask blank is a laminate before patterning, to be used for the production of a photomask. An EUV mask blank has a structure wherein a reflective layer to reflect EUV light and an absorber layer to absorb EUV light are formed in this order on a substrate made of e.g. glass. As the reflective layer, a Mo/Si multilayer reflective film is usually employed wherein a molybdenum (Mo) film as a high refractive index layer and a silicon (Si) film as a low refractive index layer are alternately laminated to increase the light ray reflectance when the layer surface is irradiated with EUV light.

For the absorber layer, a material having a high EUV light absorption coefficient, specifically a material containing chromium (Cr) or tantalum (Ta) as the main component, is employed.

A protective layer is usually formed between the reflective layer and the absorber layer. Such a protective layer is one provided for the purpose of protecting the reflective layer so that the reflective layer will not receive a damage by the etching process carried out for the purpose of forming a pattern in the absorber layer. Accordingly, for the protective layer, it is preferred to employ a material not susceptible to an influence by the etching process. Further, the protective layer is required not to lower the reflectance of EUV ray, since the reflective layer of the mask blank is irradiated with EUV light in a state where the protective layer is formed. For these reasons, as the constituting material for the protective layer, Ru or a Ru compound (such as RuB, RuNb or RuZr) is considered to be preferred.

In the production of an EUV mask blank, a sputtering method is preferably employed for the formation of the Mo/Si multilayer reflective film, the protective layer and the absorber layer for such reasons that a uniform film thickness can easily be obtained, the takt time is short, the film thickness can easily be controlled, etc. Here, for the formation of the Mo film and the Si film constituting the Mo/Si multilayer reflective film, and the protective layer, an ion beam sputtering method is preferably used, and for the formation of the absorber layer, a magnetron sputtering method is preferably employed.

The sputtering method is a film-forming method wherein a sputtering target surface is bombered by charged particles to beat out sputtered particles from the target so that the sputtered particles are deposited on a substrate disposed to face the target thereby to form a thin film. For a sputtering target to be used for such a film forming method, it is common to apply a structure wherein a target main body made of a film-forming material is held by a substrate so-called a backing plate.

Such a sputtering method has been used also at the time of forming wiring films, electrodes, element-constituting films, etc. of various electronic components in the production of electronic components such as semiconductor elements or liquid crystal display elements. In a film-forming step by a sputtering method in the production of such electronic components, generation of dust attributable to a target has been recognized as a serious problem (JP-A-2002-69627, JP-A-2002-146523). Here, "dust" is a fine particle having a diameter of e.g. at least 0.2 μm, and if such a fine particle is included in the formed thin film, it will be a cause for e.g. short circuiting between wirings or wiring disconnection, thus leading to a deterioration of the yield in the production of electronic components such as semiconductor elements or liquid crystal display elements.

From the basic principles of the target to be used for a sputtering method, the target main body has an erosion region and a non-erosion region.

Sputtered particles include ones which reach the substrate, ones which scatter around and ones which return to the target main body side. Among particles which return to the target side, particles deposited on the non-erosion region will not basically be sputtered again, and they will accumulate as a redeposition material as the sputtering progresses. If such a redeposition material is peeled by some factor, it will be included as dust in the formed thin film.

JP-A-2002-69627 and JP-A-2002-146523 propose a sputtering target which has been made possible to substantially reduce generation of dust by effectively suppressing a peeling, falling or splashing phenomenon of the redeposition material from e.g. a non-erosion region of a target main body, as a sputtering target to be used for forming wiring films, electrodes, element-constituting films, etc. of various electronic components, and a sputtering apparatus employing such a sputtering target.

In the case of the sputtering target proposed in JP-A-2002-69627, it is disclosed that by applying etching treatment or polishing treatment as surface treatment to at least a part of the non-erosion region of a target main body, it is possible to densify or planarize the redeposition material and further to improve the adhesion strength to the base material, whereby it is possible to effectively suppress generation of dust by peeling or falling of the redeposition material even at the later stage of sputtering.

Whereas, in the case of the sputtering target proposed in JP-A-2002-146523, it is disclosed that by forming a film to prevent peeling of redeposition particles by a PVD method or a CVD method on at least a part of the non-erosion region of the target main body, it is possible to densify or planarize the redeposition material and further to improve the adhesion strength to the base material, whereby it is possible to effectively suppress generation of dust by peeling or falling of the redeposition material even at a later stage of sputtering.

Here, the sputtering targets proposed in JP-A-2002-69627 and JP-A-2002-146523 are those used for a magnetron sputtering method.

DISCLOSURE OF THE INVENTION

Problems to be Solved by the Invention

Also in the production of an EUV mask blank, generation of particles attributable to the sputtering target becomes a serious problem. Especially, in the film formation of the reflective layer and the protective layer, the standard for the number of particles which may be present in an EUV mask blank is strict, and accordingly, generation of particles attributable to the sputtering target becomes a more serious problem. That is, it is problematic that if particles of a size exceeding 70 nm attributable to the sputtering target are included in a formed thin film (a reflective layer or a protective layer), defects will be formed in the EUV mask blank which will be produced. Here, in the film formation of the reflective layer and the protective layer, generation of particles attributable to the sputtering target becomes a problem for such a reason that if particles of the above size are included, when EUV lithography is carried out by using a reflective photomask prepared from such an EUV mask blank, there will be a problem such that an aberration such as deficiency or distortion is likely to be observed in the transferred pattern upon exposure.

However, the sputtering targets proposed in JP-A-2002-69627 and JPA-2002-146523 are considered to be not applicable as sputtering targets to be used for the production of EUV mask blank, for the following reasons.

As the first reason, it is pointed out that the sputtering method to be used is different.

In the production of an EUV mask blank, for the film formation of the Mo/Si multilayer reflective film and the protective layer, an ion beam sputtering method is preferably employed as mentioned above, but the sputtering targets proposed in JP-A-2002-69627 and JP-A-2002-146523 are ones to be used in a magnetron sputtering method.

As between the ion beam sputtering method and the magnetron sputtering method, the positional relation of an erosion region and a non-erosion region in the target is different from the difference in their basic principles.

As the second reason, it is pointed out that the number of sputtering targets to be used is different.

The sputtering targets proposed in JP-A-2002-69627 and JP-A-2002-146523 are ones to be used for forming e.g. wiring films, electrodes, element-constituting films, etc. of various electronic components, but in such cases, film formation is carried out by using one type of sputtering target having a composition corresponding to the films to be formed. Accordingly, with respect to one type of sputtering target having a composition corresponding to the films to be formed, etching treatment or polishing treatment is applied as surface treatment to a part of a non-erosion region, or a film to prevent peeling of redeposition particles is formed by a PVD method or a CVD method on at least a part of a non-erosion region, whereby it is possible to densify or planarize the redeposition material and to improve the adhesion strength to the base, and it is thereby possible to effectively suppress generation of dust due to peeling or falling of the redeposition material even at a later stage of sputtering.

On the other hand, in the production of an EUV mask blank, a Mo film and a Si film to constitute a Mo/Si multilayer reflective film, a protective layer and an absorber layer are formed, and accordingly, at least four types of sputtering targets are used for film deposition. Here, in the case of an absorber layer to be formed preferably by a magnetron sputtering method, it is formed in a deposition chamber different from a Mo/Si multilayer reflective film and a protective layer to be formed preferably by an ion beam sputtering method, and the Mo film and the Si film to constitute the Mo/Si multilayer reflective film, and the protective layer, are preferably formed in the same deposition chamber for such a reason that oxidation of each layer constituting the Mo/Si multilayer reflective film, particularly oxidation of the topmost layer of the multilayer reflective film is prevented thereby to prevent deterioration of the reflectance, or the takt time is short.

In such a case, film deposition is carried out in the same deposition chamber by using at least three types of sputtering targets. However, it is cumbersome to identify a non-erosion region and to apply etching treatment or polishing treatment as surface treatment to a part of such a non-erosion region, or to form a film to prevent peeling of redeposition particles by a PVD method or a CVD method on at least a part of such a non-erosion region, with respect to all of these sputtering targets, such being undesirable as leading to a deterioration of the productivity in the production of an EUV mask blank.

It is an object of the present invention to provide a process for producing an EUV mask blank, capable of reducing foreign matter attributable to a sputtering target, and a process for producing a substrate with a functional film for such a mask blank, in order to solve the above-mentioned problems of the prior art.

Means to Solve the Problems

In order to solve the above-mentioned problems, the present inventors have conducted an extensive study and as a result, have found the following.

(1) Among sputtering targets to be used for the production of EUV mask blank, the Ru target or Ru compound target to be used for the formation of the protective layer is a material having a very high film stress as compared with the Mo target and the Si target to be used for the formation of the Mo film and the Si film to constitute the Mo/Si multilayer reflective film, and when ion beam sputtering is carried out by using a material having such a high film stress, particles redeposited in a non-erosion region are more likely to be peeled to become particles.

(2) Among sputtering targets to be used for the production of EUV mask blank, the Si target to be used for the formation of the Si film to constitute the Mo/Si multilayer reflective film, the boundary between the erosion region and the non-erosion region is clear, and the erosion region and the non-erosion region can be visually ascertained.

(3) In a case where formation of the Mo/Si multilayer reflective film and formation of the Ru film or Ru compound film to constitute the protective layer are carried out by means of an ion beam sputtering method in the same deposition chamber, and the target angle, the type of process gas, the pressure of process gas, the RF power of ion source, the suppresser voltage, the ion beam voltage and the ion beam current are adjusted to be substantially the same, as described below, in the formation of the Si film of the Mo/Si multilayer reflective film and in the formation of the Ru film or Ru compound film, as between the Si target to be used for the formation of the Si film of the Mo/Si multilayer reflective film and the Ru target or Ru compound target to be used for the formation of the Ru film or Ru compound film to constitute the protective layer, the ranges of the actual erosion regions in the targets substantially agree to each other, and the Si target has a wider range of the erosion region which can be visually ascertained.

The present invention has been made on the basis of the above findings and provides a process for producing a substrate with a reflective layer for EUV lithography (EUVL), which comprises a step of alternately forming a molybdenum (Mo) film and a silicon (Si) film on a substrate to form a Mo/Si multilayer reflective film, and a step of forming a ruthenium (Ru) film or Ru compound film as a protective layer on the multilayer reflective film, wherein the formation of the Mo film, the Si film, and the Ru film or Ru compound film, is carried out in the same deposition chamber by means of an ion beam sputtering method, and the formation of the Si film, and the Ru film or Ru compound film, is conducted under conditions to satisfy the following (1) to (3); and based on an erosion region of a sputtering target (Si target) used for the formation of the Si film, an erosion region and a non-erosion region of a sputtering target (Ru target or Ru compound target) to be used for the formation of the Ru film or Ru compound film, are predicted, roughening treatment is applied to the non-erosion region thus predicted of the Ru target or Ru compound target, and then carrying out the formation of the Ru film or Ru compound film:

(1) the same type of process gas is used for the formation of the Si film and the formation of the Ru film or Ru compound film, (2) in the formation of the Ru film or Ru compound film, the target angle, the process gas pressure, the RF power of ion source, the suppresser voltage, the ion beam voltage and the ion beam current are each adjusted to be at most ±5% in variation based on the respective conditions in the formation of the Si film, (3) the sum of the absolute values in variation in (2) is at most 10%.

In the process for producing a substrate with a reflective layer for EUVL, the roughening treatment is preferably applied so that the surface roughness Ra of the non-erosion region thus predicted of the Ru target or Ru compound target becomes at least 1 μm.

Further, in the process for producing a substrate with a reflective layer for EUVL, it is preferred that the roughening treatment is applied to, in the non-erosion region thus predicted of the Ru target or Ru compound target, at least the entire region from the boundary between the erosion region thus predicted and the non-erosion region thus predicted, to at least 1/15 of the maximum dimension of the target apart from the boundary towards the periphery of the target.

Further, the present invention provides a process for producing a reflective mask blank for EUV lithography (EUVL), which comprises at least a step of alternately forming a molybdenum (Mo) film and a silicon (Si) film on a substrate to form a Mo/Si multilayer reflective film, a step of forming a ruthenium (Ru) film or Ru compound film as a protective layer on the multilayer reflective film, and a step of forming an absorber layer to absorb EUV light, on the Ru film or Ru compound film, wherein the formation of the Mo film, the Si film, and the Ru film or Ru compound film, is carried out in the same deposition chamber by means of an ion beam sputtering method, and the formation of the Si film, and the Ru film or Ru compound film, is conducted under conditions to satisfy the following (1) to (3); and based on an erosion region of a sputtering target (Si target) used for the formation of the Si film, an erosion region and a non-erosion region of a sputtering target (Ru target or Ru compound target) to be used for the formation of the Ru film or Ru compound film, are predicted, roughening treatment is applied to the non-erosion region thus predicted of the Ru target or Ru compound target, and then carrying out the formation of the Ru film or Ru compound film:

(1) the same type of process gas is used for the formation of the Si film and the formation of the Ru film or Ru compound film, (2) in the formation of the Ru film or Ru compound film, the target angle, the process gas pressure, the RF power of ion source, the suppresser voltage, the ion beam voltage and the ion beam current are each adjusted to be at most ±5% in variation based on the respective conditions in the formation of the Si film, (3) the sum of the absolute values in variation in (2) is at most 10%.

In the process for producing a reflective mask blank for EUVL of the present invention, the roughening treatment is preferably applied so that the surface roughness Ra of the non-erosion region thus predicted of the Ru target or Ru compound target becomes at least 1 μm.

In the process for producing a reflective mask blank for EUVL of the present invention, it is preferred that the roughening treatment is applied to, in the non-erosion region thus predicted of the Ru target or Ru compound target, at least the entire region from the boundary between the erosion region thus predicted and the non-erosion region thus predicted, to at least 1/15 of the maximum dimension of the target apart from the boundary towards the periphery of the target.

Advantageous Effects of the Invention

According to the present invention, it is possible to suppress particles attributable to sputtering targets to be used for the production of an EUV mask blank (or a substrate provided with a reflective layer for EUVL), whereby it is possible to obtain an EUV mask blank (or a substrate with a reflective layer for EUVL) free from defects.

In the present invention, based on an erosion region, the boundary of which is clear from a non-erosion region, of a Si target used for the formation of the Si film, an erosion region and a non-erosion region of a Ru target or Ru compound target to be used for the formation of the protective layer, are predicted, whereby it is possible to specify the non-erosion region in the Ru target or Ru compound target and to shorten the time required for the application of roughening treatment to the non-erosion region, and the productivity in the production of an EUV mask blank will be improved.

Yet, in a case where the formation of the Mo/Si multilayer reflective film and the formation of the Ru film or Ru compound film to constitute the protective layer, are carried out in the same deposition chamber by means of an ion beam sputtering method, and in the formation of the Si film of the Mo/Si multilayer reflective film and in the formation of the Ru film or Ru compound film, the target angle, the type of process gas, the pressure of process gas, the RF power of ion source, the suppresser voltage, the ion beam voltage and the ion beam current are adjusted to be substantially the same as described hereinafter, the ranges of the real erosion regions in the Si target and the Ru target or Ru compound target, substantially agree to each other, and the Si target has a wider range of the erosion region which can be visually ascertained, whereby it is unlikely to apply roughening treatment to the erosion region of the Ru target or Ru compound target, and there will be no possibility to create a new source for generating particles during the formation of the Ru film or Ru compound film.

BEST MODE FOR CARRYING OUT THE INVENTION

Now, the present invention will be described with reference to the drawings.

Figure 1:
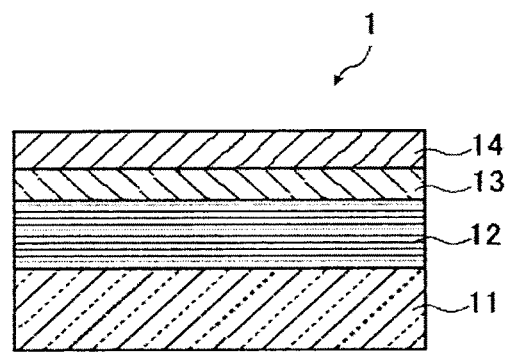
FIG. 1 is a schematic cross-sectional view illustrating one embodiment of the EUV mask blank to be produced by the process of the present invention.

FIG. 1 is a schematic cross-sectional view showing an embodiment of the EUV mask blank produced by the process of the present invention. In the mask blank 1 shown in FIG. 1, on the substrate 11, a reflective layer 12 to reflect EUV light, a protective layer 13 to protect the reflective layer 12 and an absorber layer 14 to absorb EUV light are formed in this order.

Here, the reflective layer 12 is a Mo/Si multilayer reflective film having a molybdenum (Mo) film and a silicon (Si) film alternately laminated, and the protective layer 13 is a Ru film or a Ru compound (such as RuB, RuNb or RuZr) film. The absorber layer 14 is a film formed of a material having a high EUV light absorption coefficient, and specific film materials will be described hereinafter.

As mentioned above, an ion beam sputtering method is preferably employed for the formation of the reflective layer and the protective layer for an EUV mask blank. Also in the present invention, an ion beam sputtering method is employed for the formation of the Mo film and the Si film to constitute the Mo/Si multilayer reflective film constituting the reflective layer 12, and the Ru film or Ru compound film to constitute the protective layer 13. More specifically, the film formation of the Mo film and the Si film to constitute the Mo/Si multilayer reflective film constituting the reflective layer 12, and the Ru film or Ru compound film to constitute the protective layer 13, is carried out in the same deposition chamber by means of an ion beam sputtering method.

It is preferred to carry out the formation of the Mo film and the Si film to constitute the Mo/Si multilayer reflective film constituting the reflective layer 12, and the Ru film or Ru compound film to constitute the protective layer 13 in the same deposition chamber, with a view to preventing oxidation of each layer of the Mo/Si multilayer reflective film, particularly oxidation of the topmost layer of the multilayer reflective film thereby to prevent deterioration of the reflectance and for such a reason that the takt time is short. Further, by carrying out such film depositions in the same deposition chamber by means of an ion beam sputtering method, it is possible to predict a non-erosion region of the sputtering target to be used for the formation of the Ru film or Ru compound film by the procedure which will be described hereinafter.

In the present invention, in the formation of the Si film among the Mo film and the Si film to constitute the Mo/Si multilayer reflective film constituting the reflective layer 12, and in the formation of the Ru film or Ru compound film to constitute the protective layer 13, the target angle, the type of process gas, the pressure of process gas, the RF power of ion source, the suppresser voltage, the ion beam voltage and the ion beam current are adjusted to be substantially the same, as described hereinafter. Specifically, the formation of the Si film and the formation of the Ru film or Ru compound film are carried out under conditions to satisfy the following (1) to (3):

(1) the same type of process gas is used for the formation of the Si film and the formation of the Ru film or Ru compound film, (2) in the formation of the Ru film or Ru compound film, the target angle, the process gas pressure, the RF power of ion source, the suppresser voltage, the ion beam voltage and the ion beam current are each adjusted to be at most ±5% in variation based on the respective conditions in the formation of the Si film, (3) the sum of the absolute values in variation in (2) is at most 10%.

With respect to (2), the variations of such conditions are preferably adjusted to be at most ±3%. The reason for adjusting such conditions to be substantially the same will be described later.

In the present invention, based on the erosion region in the Si target to be used for the formation of the Si film, the erosion region and the non-erosion region in the Ru target or Ru compound target to be used for the formation of the Ru film or Ru compound film are predicted.

It is the following reason that based on the erosion region in the Si target, the erosion region and the non-erosion region in the Ru target or Ru compound target to be used for the formation of the Ru film or Ru compound film are predicted.

In the present invention, in the formation of the Si film of the Mo/Si multilayer reflective film and in the formation of the Ru film or Ru compound film to constitute the protective layer, the target angle, the type of process gas, the pressure of process gas, the RF power of ion source, the suppresser voltage, the ion beam voltage and the ion beam current are adjusted to be substantially the same as described above, because as shown in Examples given hereinafter, in a case where such films are formed in the same deposition chamber by means of an ion beam sputtering method, erosion regions in the targets to be used for the film deposition substantially agree to each other. More specifically, as between the Si target to be used for the formation of the Si film and the Ru target or Ru compound target to be used for the formation of the Ru film or Ru compound film, the ranges of the real erosion regions in the targets substantially agree to each other, and the Si target has a wider range of the erosion region which can be visually ascertained.

In the present invention, in the formation of the Si film of the Mo/Si multilayer reflective film and in the formation of the Ru film or Ru compound film to constitute the protective layer, the above-mentioned conditions may be made to be substantially the same, and it is not necessary to make other conditions in the film deposition to be substantially the same. As such other conditions, the deposition time may, for example, be mentioned. The deposition time is not required to be substantially the same, because the deposition time should be changed depending upon the thickness of the film to be formed, and it does not influence the position of the erosion region and the non-erosion region in the target.

Further, the reason for predicting the erosion region and the non-erosion region in the Ru target or Ru compound target, based on the erosion region of the Si target to be used for the formation of the Si film, among the Mo film and the Si film to constitute the Mo/Si multilayer reflective film, is that as shown in Examples given hereinafter, as compared with the Mo target, the Si target presents a clear boundary between the erosion region and the non-erosion region in the target, so that the erosion region and the non-erosion region can be visually ascertained.

In the present invention, the formation of Ru film or Ru compound film is carried out after applying roughening treatment to the non-erosion region among the erosion region and the non-erosion region of the Ru target or Ru compound target predicted based on the erosion region of the Si target.

The reason for carrying out the formation of the Ru film or Ru compound film after applying roughening treatment to the non-erosion region of the Ru target or Ru compound target is as follows.

As mentioned above, in the production of an EUV mask blank, generation of particles attributable to a sputtering target during the formation of the reflective layer and the protective layer becomes a serious problem.

The present inventors have ascertained the presence or absence of generation of particles attributable to a sputtering target during ion beam sputtering, with respect to sputtering targets to be used for the formation of the reflective layer and the protective layer, specifically the Mo target and the Si target to be used for the formation of the Mo/Si multilayer reflective film, the Ru target to be used for the formation of the Ru film, and the Ru compound target (specifically a RuB target, a RuNb target, a RuZr target or the like) to be used for the formation of the Ru compound film, whereby it has been ascertained that in a case where like the Ru target or the Ru compound target, a material having a very high film stress as compared with the Mo target and the Si target to be used for the formation of the Mo film and the Si film to constitute the Mo/Si multilayer reflective film, is used to carry out ion beam sputtering, particles re-deposited on the non-erosion region are likely to be peeled to generate particles. In the case of the Mo target and the Si target, under the conditions conceivable for the formation of the Mo/Si multilayer reflective film in the production of an EUV mask blank, no such a case was observed that particles re-deposited to the non-erosion region during ion beam sputtering were peeled to generate particles.

In the present invention, by carrying out the formation of the Ru film or Ru compound film after applying roughening treatment to the non-erosion region of the Ru target or Ru compound target, generation of particles attributable to the sputtering target is prevented during the formation of the Ru film or Ru compound film.

By applying roughening treatment to the non-erosion region of the Ru target or Ru compound target, the adhesion between the particles re-deposited to the non-erosion region and the non-erosion region will be improved, whereby peeling of the particles re-deposited to the non-erosion region to become particles is prevented, and generation of particles attributable to the sputtering target will be prevented.

In the present invention, it is preferred to apply roughening treatment so that the surface roughness Ra of the non-erosion region of the Ru target or Ru compound target becomes at least 1 μm, in order to prevent peeling of particles re-deposited on the non-erosion region. In the present invention, it is more preferred to apply roughening treatment so that the surface roughness Ra of the non-erosion region becomes at least 1.7 μm, further preferred to apply roughening treatment so that such a roughness becomes at least 7.5 μm, particularly preferred to apply roughening treatment so that such a roughness becomes at least 20 μm.

In the present invention, in the non-erosion region of the Ru target or Ru compound target, it is preferred to apply roughening treatment to at least the entire region from the boundary between the erosion region and the non-erosion region to at least 1/15 of the maximum dimension of the target apart from the boundary towards the periphery of the target in order to prevent peeling of particles re-deposited on the non-erosion region, and it is more preferred to apply roughening treatment to the entire region from the boundary to at least 1/30 of the maximum dimension of the target apart from the boundary towards to the periphery of the target, further preferred to apply roughening treatment to the entire region from the boundary to at least 1/60 of the maximum dimension of the target apart from the boundary towards to the periphery of the target, particularly preferred to apply roughening treatment to the entire non-erosion region.

However, if roughening treatment is applied also to a region on the center side of the target from the boundary, the roughening treatment is applied also to the erosion region. If the roughening treatment is applied to the erosion region, the portion of the erosion region subjected to the roughening treatment will be sputtered, whereby corresponding to the area of the erosion region subjected to the roughening treatment, particles attributable to the sputtering target rather tend to increase, such being undesirable. Therefore, it is preferred not to apply roughening treatment to a region on the center side of the target located at a distance of larger than 1/30 of the maximum dimension of the target toward the center side of the target from the boundary between the erosion region and the non-erosion region, and it is more preferred not to apply roughening treatment to a region on the center side of the target located at a distance of larger than 1/60 of the maximum dimension of the target towards the center side of the target from the boundary.

Here, as mentioned above, with respect to the Si target and the Ru target or Ru compound target, the ranges of the actual erosion regions in the targets substantially agree to each other, and the Si target has a wider range of the erosion region which can be visually ascertained, and accordingly, it is possible to easily accomplish the roughening treatment to the above-described site by predicting the erosion region and the non-erosion region of the Ru target or Ru compound target based on the erosion region of the Si target and applying roughening treatment to the predicted non-erosion region.

In Examples given hereinafter, for the purpose of applying roughening treatment to the non-erosion region of the Ru target or Ru compound target, a commercially available Particle Getter (manufactured by Sunric Co., Ltd.) was attached to the non-erosion region. For the purpose of preventing generation of particles in a thin film-forming apparatus such as a sputtering apparatus, the Particle Getter is one to be attached to the inner wall of the apparatus or to an instrument in the apparatus such as a shutter, a shield or the like. The Particle Getter is disclosed also in the following Patent Documents and is incorporated in the present application by reference:

JP-A-3-87357, JP-A-5-140745, JP-A-7-18423, JP-A-2001-234325, and JP-A-2004-315948.

However, the roughening treatment to be applied to the non-erosion region of the Ru target or Ru compound target is not particularly limited so long as there will be no such a problem as modification, contamination or the like of the surface of the erosion region, and various roughening treatments to be applied to metal surfaces may be employed. A specific example of such roughening treatment may, for example, be etching treatment, polishing treatment or grinding treatment. Further, it is also possible to form a thin film of metal having a desired surface thickness or to bond a surface-roughened material to the non-erosion region of the target. Further, a surface-roughened metal plate or the like may be disposed immediately on the non-erosion region even without directly roughening the non-erosion region of the target.

In the present invention, it is possible to ascertain the erosion region of the Si target after forming the Mo/Si multilayer reflective film in the process for producing 20 EUV mask blanks, to predict an erosion region and a non-erosion region of a Ru target or Ru compound target based on the ascertained erosion region of the Si target, to apply roughening treatment to such a non-erosion region, and then to carry out formation of a Ru film or Ru compound film by using the Ru target or Ru compound target having roughening treatment applied to the non-erosion region. However, it is also possible to predict a non-erosion region of a Ru target or Ru compound target based on a knowledge obtained from the process for producing EUV mask blank carried out in the past and to carry out the production of EUV mask blank by using a Ru target or Ru compound target having roughening treatment applied to the non-erosion region. That is, it is possible to predict an erosion region and a non-erosion region of a Ru target or Ru compound target based on the erosion region of a Si target used in the process for producing EUV mask blank carried out under the same conditions as the deposition conditions for a Si film in the production of EUV mask blank to be carried out, to apply roughening treatment to such a non-erosion region, then to attach the Ru target or Ru compound target having such roughening treatment applied, and a Mo target and a Si target at prescribed positions in a sputtering apparatus, then to dispose a substrate to be used for the production of a new EUV mask blank at a prescribed position in the sputtering apparatus, and then to carry out a step of forming a Mo/Si multilayer reflective film on the substrate and a step of forming a Ru film or Ru compound film as a protective layer on such a multilayer reflective film. In such a case, roughening treatment is preliminarily applied to the non-erosion region of the Ru target or Ru compound target, whereby it is unnecessary to carry out an operation to ascertain the erosion region of the Si target after forming a Mo/Si multilayer reflective film, to predict an erosion region and a non-erosion region of a Ru target or Ru compound target based on the ascertained erosion region of the Si target and to apply roughening treatment to the non-erosion region.

Now, the materials to be used for the production of an EUV mask blank, and the deposition conditions for the reflective layer, the protective layer and the absorber layer, etc. will be described.

[Substrate]

The substrate is required to satisfy the properties as a substrate for an EUV mask blank. Therefore, the substrate is preferably one having a low thermal expansion coefficient (preferably $0\pm1.0\times10^{-7}/°$ C., more preferably $0\pm0.3\times10^{-7}/°$ C., further preferably $0\pm0.2\times10^{-7}/°$ C., still further preferably $0\pm0.1\times10^{-7}/°$ C., particularly preferably $0\pm0.05\times10^{-7}/°$ C.) at the temperature at the time of exposure and being excellent in smoothness, planarity and durability against a cleaning liquid to be used for e.g. cleaning of a mask blank or an EUV mask after forming a mask pattern. As such a substrate, glass having a low thermal expansion coefficient, e.g. $SiO_2$—$TiO_2$ type glass may specifically be used, but the substrate is not limited thereto, and a substrate made of e.g. crystallized glass having β-quartz solid solution precipitated, quartz glass, silicon or a metal, may also be used. Further, a film such as a stress-correction film may be formed on a substrate.

The substrate preferably has a smooth surface of at most 0.15 nm rms and a planarity of at most 100 nm, whereby with an EUV mask after the production, a high reflectance and a high transfer precision can be obtained.

The size, thickness, etc. of the substrate may suitably be determined depending upon e.g. designed values for an EUV mask to be produced. For example, the substrate may have a shape of 6 inch (152.4 mm) square and a thickness of 0.25 inch (6.35 mm).

It is preferred that no defects are present on the surface (deposition surface) of the substrate on which a multilayer reflective film is to be formed. However, even in a case where defects are present, in order that no phase defects are formed by concave defects and/or convex defects, it is preferred that the depth of the concave defects and the height of the convex defects are at most 2 nm, and FWHM (full width of half maximum) of such concave defects and convex defects is at most 60 nm.

[Reflective Layer]

As described above, the reflective layer of an EUV mask blank to be produced by the present invention is a Mo/Si multilayer reflective film having a molybdenum (Mo) film and a silicon (Si) film alternately laminated. That is, by laminating a Mo film being a high refractive index film and a Si film being a low refractive index film alternately a plurality of times, it is possible to accomplish a high EUV light ray reflectance.

Here, the EUV light ray reflectance is meant for a reflectance of EUV light within a wavelength range of from 12 to 15 nm when irradiated with light in a wavelength region of EUV light at an incident angle of from 2 to 10°.

With respect to the EUV light ray reflectance on the reflective layer, the maximum value is preferably at least 60%, more preferably at least 65%.

In the case of a Mo/Si multilayer reflective film, in order to obtain a reflective layer having the maximum value of EUV light ray reflectance being at least 60%, a Mo layer having a thickness of 2.3±0.1 nm and a Si layer having a thickness of 4.5±0.1 nm may be laminated so that the number of repeating units will be from 30 to 60.

The Mo/Si multilayer reflective film may be either one having a Mo film and a Si film alternately laminated in this order on a substrate or one having a Si film and a Mo film alternately laminated in this order on a substrate. However, in the latter case, it is preferred to further form a Si film on the Mo film finally formed, in order to prevent oxidation of the topmost layer.

As described above, in the present invention, a Mo/Si multilayer reflective film is formed by means of an ion beam sputtering method. As the deposition procedure, it is preferred that a Si film is formed so that the thickness would be 4.5 nm by using a Si target as a sputtering target and an Ar gas (gas pressure: $1.3\times10^{-2}$ Pa to $2.7\times10^{-2}$ Pa) as a process gas at an ion acceleration voltage of from 300 to 1,500 V at a deposition rate of from 0.03 to 0.30 nm/sec, and then, a Mo film is formed so that the thickness would be 2.3 nm in the same deposition chamber by using a Mo target as the target, and an Ar gas (gas pressure: $1.3\times10^{-2}$ Pa to $2.7\times10^{-2}$ Pa) as a process gas at an ion acceleration voltage of from 300 to 1,500 V at a deposition rate of from 0.03 to 0.30 nm/sec. This procedure is regarded as one cycle, and by laminating the Si film and the Mo film in from 40 to 50 cycles, the Mo/Si multilayer reflective film is formed.

Otherwise, in the same procedure as described above, the order of the film deposition may be reversed so that after forming the Si film, the Mo film is formed, and this procedure is regarded as one cycle, and the Si film and the Mo film are laminated in from 40 to 50 cycles to obtain a Si/Mo multilayer reflective film. In this case, it is preferred to form a Si film in a thickness of 4.5 nm on the Mo film formed by the final cycle, in the same manner as described above, from the viewpoint of prevention of oxidation of the topmost layer.

[Protective Layer]

As described above, the protective layer of an EUV mask blank to be produced by the present invention is a Ru film or Ru compound (such as RuB, RuNb or RuZr) film.

In an EUV mask blank, a protective layer is formed for the purpose of protecting a reflective layer so that the reflective layer is not damaged by an etching process when a pattern is formed on an absorber layer by the etching process, usually by a dry etching process. Accordingly, the material for the protective layer is usually selected to be a material which is less susceptible to an influence of the etching process for the absorber layer i.e. which has an etching rate slower than the absorber layer and is less susceptible to a damage by the etching process. Further, the protective layer is required not to impair the EUV light ray reflectance on the reflective layer even after forming the protective layer.

The above conditions can be satisfied by forming a Ru film or Ru compound (such as RuB, RuNb or RuZr) film as the protective layer.

In a case where the protective layer is a Ru compound layer, the content of Ru is preferably at least 50 at %, more preferably at least 80 at %, particularly preferably at least 90 at %. However, in a case where the protective layer is a RuNb film, the content of Nb in the protective layer is preferably from about 10 to 40 at %.

As the pattern becomes fine, the influence of the edge roughness becomes distinct, and accordingly, the surface of the absorber layer is required to be smooth. If the surface of the absorber layer is not smooth, the edge roughness of the pattern to be formed in the absorber layer tends to be large, and the dimensional precision of the pattern tends to be poor.

The surface of the protective layer is also required to be smooth, since the absorber layer is formed thereon. If the surface roughness of the protective layer surface is large, the surface roughness of the absorber layer to be formed on the protective layer becomes large.

From such a viewpoint, the surface roughness of the protective layer is preferably at most 0.5 nm rms. When the surface roughness of the protective layer surface is at most 0.5 nm rms, the surface roughness of the absorber layer to be formed on the protective layer becomes sufficiently smooth, whereby the dimensional stability of the pattern will not be deteriorated by an influence of the edge roughness. The surface roughness of the protective layer surface is more preferably at most 0.4 nm rms, further preferably at most 0.3 nm rms.

The thickness of the protective layer is preferably from 1 to 10 nm for such a reason that it is thereby possible to increase the EUV light ray reflectance and to obtain etching resistance properties. The thickness of the protective layer is more preferably from 1 to 5 nm, further preferably from 2 to 4 nm.

As described above, in the present invention, the Ru film or Ru compound film is formed as a protective layer by means of an ion beam sputtering method. In a case where the Ru film or Ru compound (such as RuB, RuNb or RuZr) film is to be formed as a protective layer, as the deposition procedure, the Ru film or Ru compound (such as RuB, RuNb or RuZr) film may be formed by using a Ru target or Ru compound (such as RuB, RuNb or RuZr) target as the sputtering target and an Ar gas (gas pressure: $1.3 \times 10^{-2}$ Pa to $2.7 \times 10^{-2}$ Pa) as the process gas at an ion acceleration voltage of from 300 to 1,500 V at a deposition rate of from 0.03 to 0.30 nm/sec.

Here, the substrate with a reflective layer of the present invention is a structure in a state before forming an absorber layer of an EUV mask blank of the present invention i.e. a structure excluding the absorber layer 14 from the mask blank 1 shown in FIG. 1. The substrate with a reflective layer of the present invention is one constituting a precursor for an EUV mask blank.

[Absorber Layer]

The property especially required for the absorber layer for an EUV mask blank is that the EUV light ray reflectance is extremely low. Specifically, when the absorber layer surface is irradiated with light rays within a wavelength region of EUV light, the maximum light ray reflectance in the vicinity of a wavelength of 13.5 nm is preferably at most 0.5%, more preferably at most 0.1%.

In order to accomplish the above property, the absorber layer is preferably made of a material having a high absorption coefficient of EUV light. As a specific example of the material having a high absorption coefficient of EUV light, a material composed mainly of tantalum (Ta) may be mentioned.

A specific example of the absorber layer constituted by the material composed mainly of tantalum (Ta) may be an absorber layer (TaBSiN film) containing Ta, B, Si and nitrogen (N) in the following ratio.

Content of B: at least 1 at % and less than 5 at %, preferably from 1 to 4.5 at %, more preferably from 1.5 to 4 at %

Content of Si: from 1 to 25 at %, preferably from 1 to 20 at %, more preferably from 2 to 12 at %

The compositional ratio of Ta to N (Ta:N): from 8:1 to 1:1

Content of Ta: preferably from 50 to 90 at %, more preferably from 60 to 80 at %

Content of N: preferably from 5 to 30 at %, more preferably from 10 to 25 at %

The absorber layer (TaBSiN film) of the above composition is such that its crystal state is amorphous, and it is excellent in the surface smoothness.

With the absorber layer (TaBSiN film) of the above composition, the surface roughness of the absorber layer surface can be made to be at most 0.5 nm rms. If the surface roughness of the absorber layer surface is large, the edge roughness of a pattern formed in the absorber layer becomes large, whereby the dimensional precision of the pattern becomes poor. As the pattern becomes fine, the influence of the edge roughness becomes distinct. Therefore, the surface of the absorber layer is required to be smooth.

When the surface roughness of the absorber layer surface is at most 0.5 nm rms, the absorber layer surface is sufficiently smooth, whereby there will be no deterioration of the dimensional precision of a pattern due to an influence of edge roughness.

The thickness of the absorber layer is preferably from 50 to 100 nm.

The absorber layer (TaBSiN film) having the above composition can be formed by means of a magnetron sputtering method. Specifically, the film deposition can be made by the following methods (1) to (3).

(1) The absorber layer (TaBSiN film) is formed by using a Ta target, a B target and a Si target and letting these individual targets discharge simultaneously in a nitrogen ($N_2$) atmosphere diluted with Ar.

(2) The absorber layer (TaBSiN film) is formed by using a TaB compound target and a Si target and letting these targets discharge simultaneously in an $N_2$ atmosphere diluted with Ar.

(3) The absorber layer (TaBSiN film) is formed by using a TaBSi compound target and letting this target having three elements integrated discharge in an $N_2$ atmosphere diluted with Ar.

Here, among the above methods, in a method wherein at least two targets are discharged simultaneously (method (1) or (2)), the composition of the absorber layer to be formed can be controlled by adjusting the electric power to be applied to each target.

Among the above, methods (2) and (3) are preferred in that it is thereby possible to avoid instability of the discharge or fluctuation in the composition or thickness of the film, and method (3) is particularly preferred. With the TaBSi compound target, its composition preferably comprises from 50 to 94 at % of Ta, from 5 to 30 at % of Si and from 1 to 20 at % of B, whereby it is possible to avoid instability of the discharge or fluctuation in the composition or thickness of the film, such being particularly preferred.

Formation of the absorber layer (TaBSiN film) by the above exemplified methods may specifically be carried out under the following film deposition conditions.

Method (2) Using TaB Compound Target and Si Target

Sputtering gas: a mixed gas of Ar and $N_2$ ($N_2$ gas concentration: from 3 to 80 vol %, preferably from 5 to 30 vol %, more preferably from 8 to 15 vol %; gas pressure: from $1.0 \times 10^{-1}$ Pa to $10 \times 10^{-1}$ Pa, preferably from $1.0 \times 10^{-1}$ Pa to $5 \times 10^{-1}$ Pa, more preferably from $1.0 \times 10^{-1}$ Pa to $3 \times 10^{-1}$ Pa)

Electric power applied (to each target): from 30 to 1,000 W, preferably from 50 to 750 W, more preferably from 80 to 500 W Film deposition rate: from 2.0 to 60 nm/sec, preferably from 3.5 to 45 nm/sec, more preferably from 5 to 30 nm/sec Method (3) Using TaBSi Compound Target Sputtering gas: a mixed gas of Ar and $N_2$ ($N_2$ gas concentration: from 3 to 80 vol %, preferably from 5 to 30 vol %, more preferably from 8 to 15 vol %; gas pressure: from $1.0 \times 10^{-1}$ Pa to $10 \times 10^{-1}$ Pa, preferably from $1.0 \times 10^{-1}$ Pa to $5 \times 10^{-1}$ Pa, more preferably from $1.0 \times 10^{-1}$ Pa to $3 \times 10^{-1}$ Pa)

Electric power applied: from 30 to 1,000 W, preferably from 50 to 750 W, more preferably from 80 to 500 W Film deposition rate: from 2.0 to 60 nm/sec, preferably from 3.5 to 45 nm/sec, more preferably from 5 to 30 nm/sec In the process for producing an EUV mask blank of the present invention, in addition to the reflective layer, the protective layer and the absorber layer, functional films known in the field of EUV mask blank may be provided to the EUV mask blank. As a specific example of such a functional film, a highly dielectric coating to be applied on the rear side (to the deposition side) of the substrate to promote electrostatic chucking of the substrate may be mentioned as disclosed, for example, in JPA-2003-501823. For such a highly dielectric coating to be applied on the rear side of the substrate for such a purpose, the electrical conductivity and the thickness of the constituting material are selected so that the sheet resistance will be at most 100 $\Omega/\square$. The constituting material for the highly dielectric coating can be widely selected from those disclosed in known literatures. For example, a highly dielectric coating disclosed in JP-A-2003-501823, specifically a coating made of silicon, titanium nitride, molybdenum, chromium and tantalum silicide, may be applied. The thickness of such a highly dielectric coating may, for example, be from 10 to 1,000 nm.

The highly dielectric coating may be formed by a known film-forming method, for example, a sputtering method such as a magnetron sputtering method or an ion beam sputtering method, a CVD method, a vacuum vapor deposition method or an electrolytic plating method.

Another specific example of a functional film may, for example, be a low reflection layer to an inspection light of a mask pattern to be formed, as the case requires, on the absorber layer for the purpose of improving the contrast at the time of the inspection of a mask pattern, or a resist film to be applied on the absorber layer (or on the low reflective layer, in a case where the low reflective layer is formed on the absorber layer), as required for the formation of a mask pattern by exposure.

EXAMPLES

Now, the present invention will be described in detail with reference to Examples, but it should be understood that the present invention is by no means restricted to such Examples.

Example 1

In this Example, a substrate with a reflective layer having, formed on the substrate, a Mo/Si multilayer reflective film as the reflective layer and a Ru film as a protective layer, was prepared by the following procedure.

As the substrate 11 for film deposition, a $SiO_2$—$TiO_2$ type glass substrate (shape: 6 inch (152.4 mm) square, thickness: 6.35 mm) was used. This glass substrate had a thermal expansion coefficient of $0.2 \times 10^{-7}/°$ C., a Young's modulus of 67 GPa, a Poisson's ratio of 0.17 and a specific rigidity of $3.07 \times 10^7$ $m^2/s^2$. This glass substrate was polished to have a smooth surface of at most 0.15 nm rms and a planarity of at most 100 nm.

On the rear side of the substrate, a CrN film having a thickness of 100 nm was formed by means of a magnetron sputtering method to provide a highly dielectric coating (not shown) having a sheet resistance of 100 $\Omega/\square$. Using the formed CrN film, the substrate (shape: 6 inch (152.4 mm) square, thickness: 6.35 mm) was fixed to a usual electrostatic chuck having a flat plate shape, and on the surface of the substrate, a Mo film and a Si film were alternately formed for 50 cycles by means of an ion beam sputtering method to form a Mo/Si multilayer reflective film having a total thickness of 340 nm ((2.3 nm+4.5 nm)×50).

The deposition conditions for the Mo film and the Si film are as follows. Here, the target angle of 0° represents a case where the target faced the ion source.

Deposition Conditions for Mo Film
　Target: Mo target
　Process gas: Ar gas (gas pressure: 0.027 Pa)
　RF power of ion source: 350 W
　Suppresser voltage: −500 V
　Ion beam voltage: 600 V
　Ion beam current: 0.3 A
　Target angle: 54°
　Deposition rate: 0.044 nm/sec
　Film thickness: 2.3 nm Deposition Conditions for Si Film
　Target: Si target (boron-doped)
　Process gas: Ar gas (gas pressure: 0.027 Pa)
　RF power of ion source: 350 W
　Suppresser voltage: −500 V
　Ion beam voltage: 600 V
　Ion beam current: 0.3 A
　Target angle: 54°
　Deposition rate: 0.094 nm/sec
　Film thickness: 4.5 nm Then, in the same deposition chamber as used for the formation of the Mo/Si multilayer reflective film, a Ru film as a protective film was formed by means of an ion beam sputtering method to obtain a substrate with a reflective layer. Here, the setting positions for the Mo target, the Si target and the Ru target to the substrate during the deposition of the Mo film, the Si film and the Ru film and the target angles of the Mo target, the Si target and the Ru target to the ion source, were the same.

As the Ru target, one having roughening treatment applied by attaching a Particle Getter (manufactured by Sunric Co., Ltd.) to a non-erosion region among an erosion region and a non-erosion region predicted based on the erosion region of the Si target used at the time of producing the substrate with a reflective layer under the same conditions as in Example 1 i.e. the Si target used for the formation of the Si film under the same conditions as in Example 1, was used.

Figure 2:
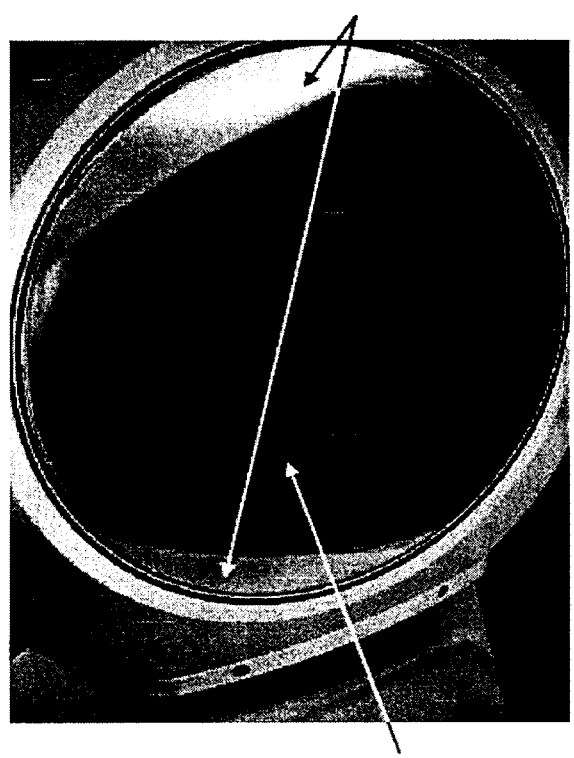
FIG. 2 is a photograph showing a Si target used for prediction of an erosion region and a non-erosion region for a Ru target in Example 1.

FIG. 2 shows the Si target used for predicting an erosion region and a non-erosion region of the Ru target. The Si target shown in FIG. 2 is one used for the production of the substrate with a reflective layer under the same conditions as in Example 1, i.e. one used for the formation of the Si film of the Mo/Si multilayer reflective film under the same conditions as in Example 1. In the Si target shown in FIG. 2, the boundary between the erosion region and the non-erosion region is clear, and the erosion region and the non-erosion region can be visually ascertained.

Figure 3:
FIG. 3 is a photograph showing a Mo target used together with the Si target shown in FIG. 2 for the formation of a Mo/Si multilayer reflective film.

FIG. 3 shows the Mo target used together with the Si target shown in FIG. 2, to form the Mo/Si multilayer reflective film. The Mo target shown in FIG. 3 is one used for the production of the substrate with a reflective layer under the same conditions as in Example 1, i.e. one used for the formation of the Mo film of the Mo/Si multilayer reflective film under the same conditions as in Example 1. As is evident from FIG. 3, in the Mo target, as compared with the Si target, the boundary between the erosion region and the non-erosion region is not clear, such being not suitable for visually ascertaining the erosion region and the non-erosion region.

Figure 4:
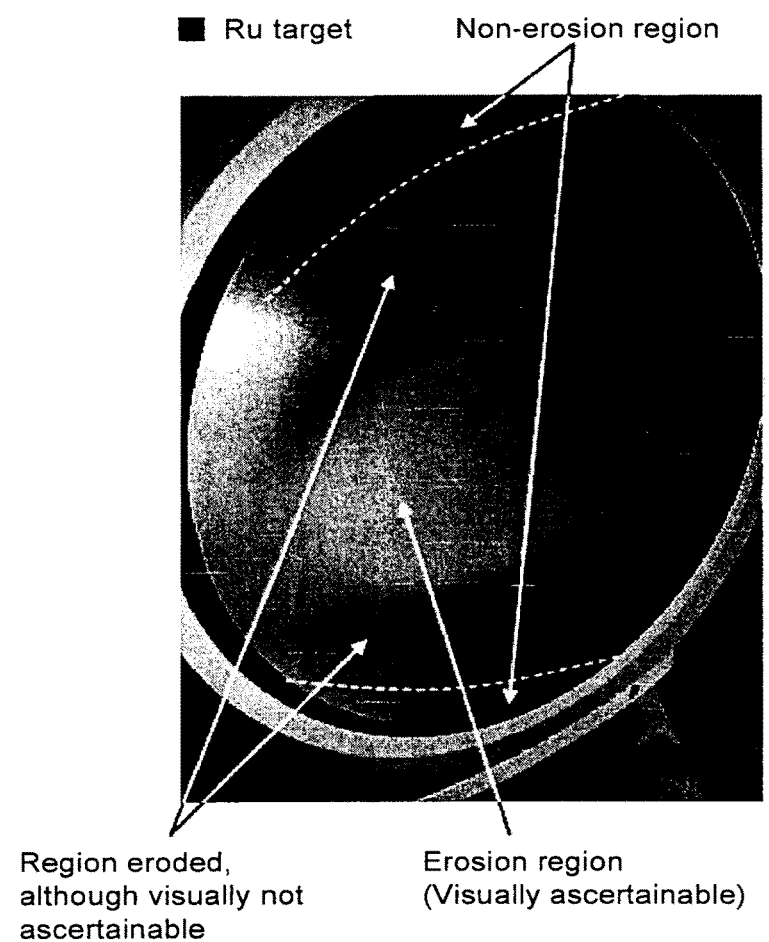
FIG. 4 is a photograph showing a Ru target used together with the Si target shown in FIG. 2 and the Mo target shown in FIG. 3 for the production of a substrate with a reflective layer.

FIG. 4 shows the Ru target used together with the Si target shown in FIG. 2, to produce an EUV mask blank. The Ru target shown in FIG. 4 is one used for the production of the substrate with a reflective layer under the same conditions as in Example 1, i.e. one used for the formation of the Ru film as the protective layer under the same conditions as in Example 1. As is evident from the comparison between FIGS. 2 and 4, with respect to the Ru target and the Si target, the ranges of the real erosion regions in the targets substantially agree to each other, and the Si target has a wider range of the erosion region which can be visually ascertained. Here, the fact that in the actual erosion region of the Ru target, an erosion region which cannot be visually ascertained was eroded, was indirectly judged from the fact that when formation of the Ru film was carried out by attaching the Particle Getter to the same region, Cu as the base material of the Particle Getter was substantially observed on the substrate. Here, for the detection and analysis of Cu, the same procedure as the after-mentioned defect-measuring method and defect-analyzing method was employed.

Further, another method to identify the erosion region which is not visually ascertainable in the actual erosion region of the Ru target, the erosion profile may be measured by means of a depth meter. It is thereby possible to accurately know the eroded degree (erosion degree) of the target.

The deposition conditions for the Ru film as the protective layer are as follows.
Target: Ru target
Process gas: Ar gas (gas pressure: 0.027 Pa)
RF power of ion source: 350 W
Suppresser voltage: −500 V
Ion beam voltage: 600 V
Ion beam current: 0.3 A
Target angle: 54°
Deposition rate: 0.054 nm/sec
Film thickness: 2.5 nm In the above-described procedure, 20 plates of the substrate with a reflective layer were prepared, and defects having sizes of at least 70 nm were measured by means of a defect inspection machine for EUV mask blank (M1350 manufactured by Lasertec Corporation), and among them, with respect to all defects having sizes of at least 100 nm, the composition analysis of defects was carried out by means of FIB/SEM (Altula835 manufactured by FEI Company) and EDX (INCA mics/x-stream//SEM Si (Li), manufactured by Oxford Instruments), whereby the number of Ru particles was 1.550 particles/sheet on average, and the standard deviation was 0.887 particles/plate.

Comparative Example 1

45 plates of a substrate with a reflective layer were prepared in the same manner as in Example 1 except that no Particle Getter was attached to the Ru target.

In the same manner as in Example, defects having sizes of at least 70 nm were measured, and among them, with respect to all defects having sizes of at least 100 nm, the composition analysis was carried out, and the number of Ru particles was measured, whereby the number of Ru particles was 2.178 particles/plate on average, and the standard deviation was 1.419 particles/plate.

Whether or not the difference in the results obtained in Example 1 and Comparative Example 1 is regarded as a significant difference, can be determined by carrying out a significant difference test between the two groups. Therefore, the test was carried out by the following procedure.

(1) Firstly, in order to judge a test method to carry out the test for significant difference, F-test was carried out by using the number of samples, the average and the standard deviation of the respective two groups to judge whether the two groups are homoscedastic or heteroscedastic.

As a result, at a significant level of 5% (degree of reliability: 95%), a conclusion that they are heteroscedastic, was obtained.

(2) Then, using the number of samples, the average and the standard deviation of the respective two groups and using Welch's t-test to be used for the significant difference test between heteroscedastic two groups, the significant difference test between the two groups was carried out, whereby at a significant level of 5% (degree of reliability: 95%), a conclusion that there is a significant difference between the two groups, was obtained.

Thus, it was judged that the difference in the results obtained in Example 1 and Comparative Example 1 was not by chance, but a significant difference.

MEANINGS OF SYMBOLS

1: Mask blank
11: Substrate
12: Reflective layer (multilayer reflective film)
13: Protective layer
14: Absorber layer

What is claimed is:
1. A process for producing a substrate with a reflective layer for EUV lithography, comprising:
alternately forming a Mo film and a Si film on a substrate such that a Mo/Si multilayer reflective film is formed on the substrate;

applying roughening treatment to a non-erosion region of a Ru or Ru compound sputtering target for formation of a protective layer comprising a Ru film or Ru compound film such that the non-erosion region of the Ru or Ru compound sputtering target has a surface roughness Ra of at least 7.5 μm; and forming the protective layer comprising the Ru film or Ru compound film on the Mo/Si multilayer reflective film, wherein the forming of the Mo/Si multilayer reflective film and the forming of the protective layer are carried out in the same deposition chamber by an ion beam sputtering method, the non-erosion region and an erosion region of the Ru or Ru compound sputtering target for the formation of the protective layer are predicted based on an erosion region of a Si sputtering target for formation of the Si film, the formation of the Si film and the formation of the protective film are carried out with the same type of process gas, and the formation of the protective layer includes adjusting a target angle, a process gas pressure, an RF power of ion source, a suppresser voltage, an ion beam voltage and an ion beam current to be at most ±5% in variation based on a target angle, a process gas pressure, an RF power of ion source, a suppresser voltage, an ion beam voltage and an ion beam current in the formation of the Si film and the sum of the absolute values in the variation to be at most 10%.

2. The process for producing a substrate with a reflective layer for EUV lithography according to claim 1, wherein in the non-erosion region of the Ru or Ru compound sputtering target, the roughening treatment is applied to at least the entire region from the boundary between the erosion region and the non-erosion region to at least ¹⁄₁₅ of the maximum dimension of the Ru or Ru compound sputtering target apart from the boundary towards the periphery of the Ru or Ru compound sputtering target.

3. The process for producing a substrate with a reflective layer for EUV lithography according to claim 1, wherein in the non-erosion region of the Ru or Ru compound sputtering target, the roughening treatment is applied to at least the entire region from the boundary between the erosion region and the non-erosion region to at least ¹⁄₁₅ of the maximum dimension of the Ru or Ru compound sputtering target apart from the boundary towards the periphery of the Ru or Ru compound sputtering target such that the surface roughness Ra becomes at least 20 μm.

4. A process for producing a reflective mask blank for EUV lithography, comprising:
alternately forming a Mo film and a Si film on a substrate such that a Mo/Si multilayer reflective film is formed on the substrate;
applying roughening treatment to a non-erosion region of a Ru or Ru compound sputtering target for formation of a protective layer comprising a Ru film or Ru compound film such that the non-erosion region of the Ru or Ru compound sputtering target has a surface roughness Ra of at least 7.5 μm;
forming a protective layer comprising a Ru film or Ru compound film on the Mo/Si multilayer reflective film; and
forming on the protective layer an absorber layer which absorbs EUV light,
wherein the forming of the Mo/Si multilayer reflective film and the forming of the protective layer are carried out in the same deposition chamber by an ion beam sputtering method, the non-erosion region and an erosion region of the Ru or Ru compound sputtering target for the formation of the protective layer are predicted based on an erosion region of a Si sputtering target for formation of the Si film, the formation of the Si film and the formation of the protective film are carried out with the same type of process gas, and the formation of the protective layer includes adjusting a target angle, a process gas pressure, an RF power of ion source, a suppresser voltage, an ion beam voltage and an ion beam current to be at most ±5% in variation based on a target angle, a process gas pressure, an RF power of ion source, a suppresser voltage, an ion beam voltage and an ion beam current in the formation of the Si film and the sum of the absolute values in the variation to be at most 10%.

5. The process for producing a reflective mask blank for EUV lithography according to claim 4, wherein in the non-erosion region of the Ru or Ru compound sputtering target, the roughening treatment is applied to at least the entire region from the boundary between the erosion region and the non-erosion region to at least ¹⁄₁₅ of the maximum dimension of the Ru or Ru compound sputtering target apart from the boundary towards the periphery of the Ru or Ru compound sputtering target.

6. The process for producing a reflective mask blank for EUV lithography according to claim 4, wherein in the non-erosion region of the Ru or Ru compound sputtering target, the roughening treatment is applied to at least the entire region from the boundary between the erosion region and the non-erosion region to at least ¹⁄₁₅ of the maximum dimension of the Ru or Ru compound sputtering target apart from the boundary towards the periphery of the Ru or Ru compound sputtering target, such that the surface roughness Ra becomes at least 20 μm.

7. The process for producing a substrate with a reflective layer for EUV lithography according to claim 1, wherein in the non-erosion region of the Ru or Ru compound sputtering target, the roughening treatment is applied to at least the entire region from the boundary between the erosion region and the non-erosion region to at least ¹⁄₃₀ of the maximum dimension of the Ru or Ru compound sputtering target apart from the boundary towards the periphery of the Ru or Ru compound sputtering target.

8. The process for producing a substrate with a reflective layer for EUV lithography according to claim 1, wherein in the non-erosion region of the Ru or Ru compound sputtering target, the roughening treatment is applied to at least the entire region from the boundary between the erosion region and the non-erosion region to at least ¹⁄₆₀ of the maximum dimension of the Ru or Ru compound sputtering target apart from the boundary towards the periphery of the Ru or Ru compound sputtering target.

9. The process for producing a substrate with a reflective layer for EUV lithography according to claim 1, wherein the Mo/Si multilayer reflective film is formed such that the Mo film is formed on the substrate and the Si film is formed on the Mo film.

10. The process for producing a substrate with a reflective layer for EUV lithography according to claim 1, wherein the Mo/Si multilayer reflective film is formed such that the Si film is formed on the substrate, the Mo film is formed on the Si film, and a topmost layer comprising a Si film is formed.

11. The process for producing a substrate with a reflective layer for EUV lithography according to claim 1, wherein the protective layer is made of the Ru compound film, and the Ru compound film is selected from the group consisting of a RuB film, a RuNb film and a RuZr film.

12. The process for producing a reflective mask blank for EUV lithography according to claim 4, wherein in the non-erosion region of the Ru or Ru compound sputtering target, the roughening treatment is applied to at least the entire region from the boundary between the erosion region and the non-erosion region to at least 1/30 of the maximum dimension of the Ru or Ru compound sputtering target apart from the boundary towards the periphery of the Ru or Ru compound sputtering target.

13. The process for producing a reflective mask blank for EUV lithography according to claim 4, wherein in the non-erosion region of the Ru or Ru compound sputtering target, the roughening treatment is applied to at least the entire region from the boundary between the erosion region and the non-erosion region to at least 1/60 of the maximum dimension of the Ru or Ru compound sputtering target apart from the boundary towards the periphery of the Ru or Ru compound sputtering target.

14. The process for producing a reflective mask blank for EUV lithography according to claim 4, wherein the Mo/Si multilayer reflective film is formed such that the Mo film is formed on the substrate and the Si film is formed on the Mo film.

15. The process for producing a reflective mask blank for EUV lithography according to claim 4, wherein the Mo/Si multilayer reflective film is formed such that the Si film is formed on the substrate, the Mo film is formed on the Si film, and a topmost layer comprising a Si film is formed.

16. The process for producing a reflective mask blank for EUV lithography according to claim 4, wherein the protective layer is made of the Ru compound film, and the Ru compound film is selected from the group consisting of a RuB film, a RuNb film and a RuZr film.

17. The process for producing a reflective mask blank for EUV lithography according to claim 4, wherein the absorber layer is a film comprising Ta as a main component.

18. The process for producing a reflective mask blank for EUV lithography according to claim 4, wherein the absorber layer is a film comprising TaBSiN having Ta as a main component.

19. The process for producing a reflective mask blank for EUV lithography according to claim 4, wherein the absorber layer is a film comprising Cr as a main component.

* * * * *